US009195283B2

(12) United States Patent
Chen et al.

(10) Patent No.: US 9,195,283 B2
(45) Date of Patent: Nov. 24, 2015

(54) ELECTRONIC DEVICE

(71) Applicants: Inventec (Pudong) Technology Corporation, Shanghai (CN); INVENTEC CORPORATION, Taipei (TW)

(72) Inventors: Jing Chen, Shanghai (CN); Chien-Lung Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 426 days.

(21) Appl. No.: 13/776,678

(22) Filed: Feb. 25, 2013

(65) Prior Publication Data

US 2014/0133090 A1 May 15, 2014

(30) Foreign Application Priority Data

Nov. 12, 2012 (CN) .......................... 2012 1 0448844

(51) Int. Cl.
*G06F 1/20* (2006.01)
*H05K 7/20* (2006.01)
(52) U.S. Cl.
CPC .............. *G06F 1/20* (2013.01); *H05K 7/20145* (2013.01); *H05K 7/20727* (2013.01)
(58) Field of Classification Search
CPC ............ G06F 1/20; G06F 1/303; G06F 1/206

USPC ............. 361/679.47, 679.51, 679.46, 679.48, 361/679.49, 679.5, 679.52
See application file for complete search history.

(56) References Cited

U.S. PATENT DOCUMENTS

| 7,310,228 | B2 * | 12/2007 | Chen ............................. 361/695 |
| 7,505,266 | B2 * | 3/2009 | Sanchez et al. ............... 361/695 |
| 8,009,417 | B2 * | 8/2011 | Searby et al. .............. 361/679.5 |
| 2004/0095723 | A1 * | 5/2004 | Tsai et al. ..................... 361/695 |

FOREIGN PATENT DOCUMENTS

| TW | M317734 | 8/2007 |
| TW | 201206327 A | 2/2012 |
| TW | 201226836 A | 7/2012 |

* cited by examiner

*Primary Examiner* — Anthony Haughton
(74) *Attorney, Agent, or Firm* — CKC & Partners Co., Ltd.

(57) ABSTRACT

An electronic device includes a motherboard, at least one heat dissipation module, a fan module and a wind scooper. The heat dissipation module is arranged on the motherboard and provided with a first positioning component. The fan module is arranged on one side of the motherboard and faces the heat dissipation module. The wind scooper has a second positioning component corresponding to the first positioning component. The wind scooper is fixed on the heat dissipation module through the cooperation between the first positioning component and the second positioning component. The wind scooper is connected between the fan module and the heat dissipation modules, so that the airflow provided by the fan module can flow through the heat dissipation module.

10 Claims, 6 Drawing Sheets

ELECTRONIC DEVICE

RELATED APPLICATIONS

This application claims priority to China Application Serial Number 201210448844.3, filed Nov. 12, 2012, which is herein incorporated by reference.

BACKGROUND

1. Technical Field

The present disclosure relates to an electronic device, and more particularly relates to a server.

2. Description of Related Art

In recent years, with the rapid development of science and technology, the operation speed of an electronic device is being constantly increased. Additionally, with the efficiency improvement of the electronic device, the heating power of electronic parts of the electronic device is also constantly increased. In order to prevent the temporary or permanent failure of the electronic parts due to overheat, the electronic device should provide the electronic parts with sufficient heat dissipation efficiency. Therefore, for the electronic parts with high heating power (such as a central processing unit or graphics chip and the like), generally heat dissipation modules such as heat dissipation fins are additionally arranged to decrease the temperature of these electronic parts. Additionally, the electronic parts are generally located in an enclosure of the electronic device. In order to dissipate the heat absorbed by the heat dissipation modules fully out of the enclosure, the efficiency of heat convection in the enclosure is also one of problems worthy of attention.

For a server, the server should have enough stability and reliability to prevent the service provided thereby from being interrupted. Therefore, a flow guiding structure with an auxiliary heat dissipation function is often arranged in the enclosure of the server to increase the efficiency of heat convection. For example, fans may be arranged on one side of a motherboard in the server, and a wind scooper may be arranged on the fan and the motherboard, so that the wind scooper is connected between the fan and the electronic parts on the motherboard. Therefore, the airflow blown out by the fan can dissipate the heat generated by the electronic parts on the motherboard out of the enclosure as being guided by the wind scooper, so as to decrease the temperature of the server and stabilize the operation thereof.

Since the wind scooper shields parts of the electronic parts, when it needs to disassemble/assemble or repair these electronic parts, the wind scooper also needs to be frequently disassembled or assembled to expose these electronic parts. Therefore, the wind scooper is generally designed as a form capable to be disassembled and assembled without a tool. In other words, the wind scooper can be assembled and disassembled simply without a tool. Therefore, a conventional wind scooper is often directly placed in the interior of the server, so that an assembly line worker cannot check whether the wind scooper is precisely installed in place, and the wind scooper is not fixed in the interior of the server. In such a way, during the transportation process of the server, the wind scooper may easily move relative to other parts and thus damage these parts.

SUMMARY

The present disclosure provides an electronic device, for improving the stability of a wind scooper which is capable of being disassembled and assembled without a tool.

The present disclosure provides an electronic device, including a motherboard, at least one heat dissipation module, a fan module and a wind scooper. The heat dissipation module is arranged on the motherboard and has a first positioning component. The fan module is located on one side of the motherboard and faces the heat dissipation module. The wind scooper has a second positioning component corresponding to the first positioning component. The wind scooper is fixed on the heat dissipation module through the cooperation between the first positioning component and the second positioning component. The wind scooper is connected between the fan module and the heat dissipation module, so that the airflow provided by the fan module can flow through the heat dissipation module.

In an embodiment of the present disclosure, the heat dissipation module mentioned above includes a heat dissipation element and a heat dissipation enclosure. The heat dissipation element is placed in the heat dissipation enclosure. The second positioning component is a fastener arranged on the wind scooper. The fastener has a fastening hook component. The first positioning component is a fastening convex component protrudes beyond the heat dissipation enclosure. The wind scooper is fixed onto the heat dissipation module by fixing the fastening hook component correspondingly to the fastening convex component.

In an embodiment of the present disclosure, the fastener mentioned above has a pressing component. The pressing component protrudes beyond the wind scooper. For the wind scooper, the fastening relation between the fastening hook component and the fastening convex component is released by pressing the pressing component.

In an embodiment of the present disclosure, the fan module mentioned above further has a third positioning component. The wind scooper further has a fourth positioning component corresponding to the third positioning component. The wind scooper is fixed on the fan module through the cooperation between the third positioning component and the fourth positioning component.

In an embodiment of the present disclosure, the fan module mentioned above includes a fan bracket and a plurality of fans. The fan bracket is arranged on one side of the motherboard. The fans are arranged in the fan bracket.

In an embodiment of the present disclosure, the fourth positioning component is at least one positioning column arranged on the wind scooper. The third positioning component is at least one positioning hole arranged on the fan bracket. The wind scooper is assembled onto the fan module by enabling the positioning column to correspondingly penetrate into the positioning hole.

In an embodiment of the present disclosure, the wind scooper mentioned above includes an air inlet and at least one first air outlet. The air inlet is located on a first side of the wind scooper corresponding to the fan module. The first air outlet is located on a second side of the wind scooper corresponding to the heat dissipation module, so that the airflow provided by the fan module can flow through the heat dissipation module via the first air outlet from the wind inlet, wherein the second side is opposite to the first side. The third positioning component and the fourth positioning component are located at the air inlet. The first positioning component and the second positioning component are located at the first air outlet.

In an embodiment of the present disclosure, the electronic device mentioned above further includes at least one memory module, which is arranged on the motherboard and located on one side of the heat dissipation module. The wind scooper further includes at least one second air outlet. The second air outlet is located on the second side of the wind scooper corresponding to the memory module and is adjacent to the first air outlet, so that the airflow provided by the fan module can flow through the memory module via the second air outlets from the wind inlet.

In an embodiment of the present disclosure, two heat dissipation modules and two memory modules are arranged on the motherboard as being staggered. Also, two first air outlets and two second air outlets are arranged on the second side as being staggered, so that the first air outlet and the second air outlet respectively correspond to the heat dissipation module and the memory module.

In an embodiment of the present disclosure, the electronic device mentioned above further includes at least one heating element, which is arranged on the motherboard. The heat dissipation module thermally contacts the heating element, and the airflow provided by the fan module can flow through the heating elements via the first air outlet from the wind inlet.

Based on the description above, the heat dissipation module of the electronic device of the present disclosure has the first positioning component, and the wind scooper has the second positioning component. Therefore, the wind scooper is fixed on the heat dissipation module through the cooperation between the first positioning component and the second positioning component. Therefore, for the electronic device, the wind scooper and other parts of the electronic device are stably combined without additional fixing elements, so that the wind scooper is prevented from being displaced to strike and damage the other parts of the electronic device during the transportation process. Thus the electronic device can improve the stability of the wind scooper which is capable of being assembled and disassembled without a tool.

In order to make the features and advantages mentioned above of the present disclosure more apparent, specific embodiments are listed hereafter to make a detailed description with reference to the accompanying drawings.

DETAILED DESCRIPTION

Figure 1:
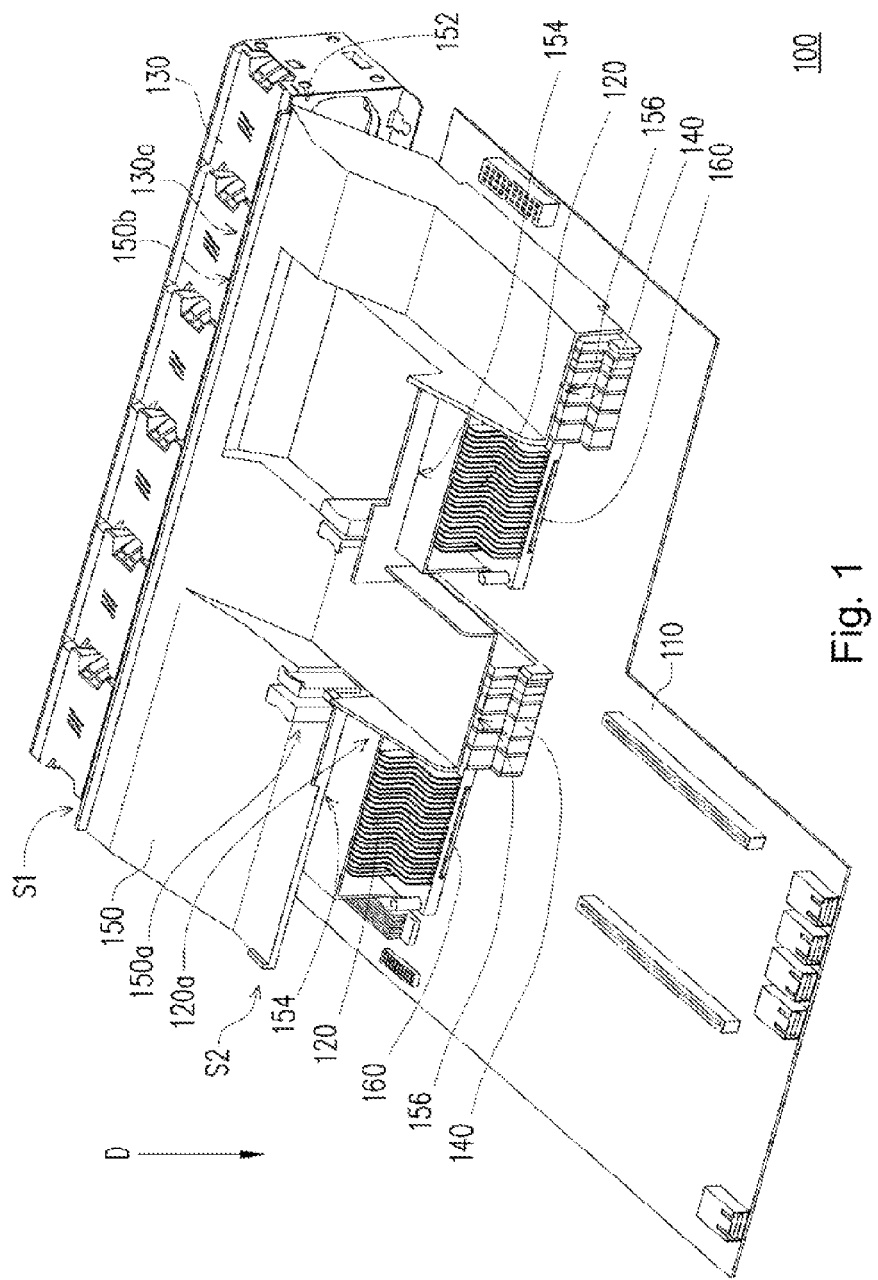
FIG. 1 is a schematic diagram of an electronic device according to an embodiment of the present disclosure.

FIG. 1 is a schematic diagram of an electronic device according to an embodiment of the present disclosure. Referring to FIG. 1, in this embodiment, the electronic device 100 includes a motherboard 110, two heat dissipation modules 120, a fan module 130, two memory modules 140 and a wind scooper 150. The electronic device 100, for example, is a server, but the type of the electronic device 100 is not limited to this in the present disclosure.

The heat dissipation modules 120 are arranged on the motherboard 110. The memory modules 140 are arranged on the motherboard 110 and located on one side of the heat dissipation modules 120. The fan module 130 is arranged on one side of the motherboard 110 and faces the heat dissipation modules 120 and the memory modules 140. Since the number of the heat dissipation modules 120 and that of the memory modules 140 are respectively two, the dissipation modules 120 and the memory modules 140 of this embodiment are arranged on the motherboard 110 as being staggered. However, in other embodiments, the number and the position of the heat dissipation modules 120 and the memory modules 140 can be adjusted in the electronic device according to demands, but the present disclosure is not limited to that.

Additionally, in this embodiment, the electronic device 100 further includes heating elements 160 arranged on the motherboard 110. The heating elements 160, for example, are a central processing unit or other elements which generate heat in operation. The type of the heating elements is not limited in the present disclosure, as well as the number of the heating elements. This embodiment takes two heating elements 160 as examples, so that correspondingly the two heat dissipation modules 120 thermally contact the heating element 160. Therefore, the heating elements 160 can dissipate the heat through the heat dissipation modules 120.

In this embodiment, the heat dissipation module 120 has a first positioning component 120a, and the wind scooper 150 has a second positioning component 150a corresponding to the first positioning component 120a. Additionally, the fan module 130 further has a third positioning component 130a. The wind scooper 150 further has a fourth positioning component 150b corresponding to the third positioning component 130a. Therefore, the wind scooper 150 is fixed onto the heat dissipation module 120 through the cooperation between the first positioning component 120a and the second positioning component 150a, and further fixed on the fan module 130 through the cooperation between the third positioning component 130a and the fourth positioning component 150b. The wind scooper 150 is connected between the fan module 130, the heat dissipation module 120 and the memory module 140, so that the airflow provided by the fan module 130 can flow through the heat dissipation module 120 and the memory module 140. Details are given hereafter through the words and the accompanying drawings.

Figure 2:
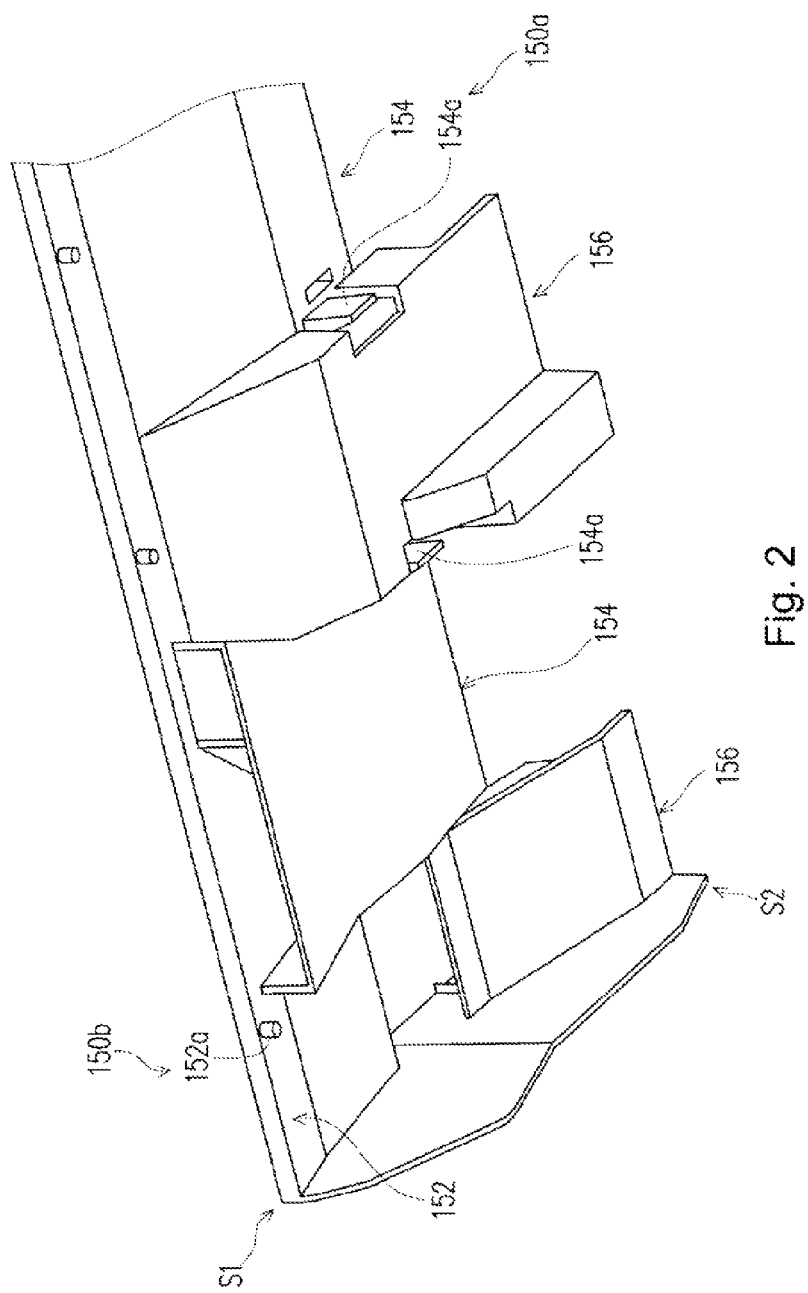
FIG. 2 is a schematic diagram of a wind scooper shown in FIG. 1.

FIG. 2 is a schematic diagram of a wind scooper shown in the FIG. 1. Referring both to FIGS. 1 and 2, in this embodiment, the wind scooper 150 includes an air inlet 152, two first air outlets 154 and two second air outlets 156. The air inlet 152 is located on the first side S1 of the wind scooper 150 corresponding to the fan module 130. The first air outlets 154 are located on the second side S2 of the wind scooper 150 corresponding to the heat dissipation modules 120, wherein the second side S2 is opposite to the first side S1. The second air outlets 156 are located on the second side S2 of the wind scooper 150 corresponding to the memory modules 140 and adjacent to the first air outlets 154.

In this embodiment, the two first air outlets 154 and the two second air outlets 156 are arranged on the second side S2 as being staggered so that the first air outlets 154 and the second air outlets 156 respectively correspond to the heat dissipation modules 120 and the memory modules 140. In this way, the airflow provided by the fan module 130 can flow through the heat dissipation modules 120 via the first air outlets 154 from the wind inlet and flow through the memory modules 140 via the second air outlets 156.

In addition, the first air outlets 154 of the wind scooper 150 also correspond to the heating elements 160. Therefore, the airflow provided by the fan module 130 can flow through the heating elements 160 via the first air outlets 154 from the air inlet 152, so as to improve the heat dissipation efficiencies of the heat dissipation modules 120. However, in other embodiments, the number and the position of the first air outlets 154 and the second air outlets 156 can be adjusted in the electronic device according to that of the heat dissipation modules 120 and the memory modules 140, but the present disclosure is not limited to that.

Additionally, in this embodiment, the first air outlets 154 and the second air outlets 156 are non-closed openings. After the airflow provided by the fan module 130 flows through the heat dissipation modules 120 via the first air outlets 154 from the air inlet 152 and flows through the memory modules 140 via the second air outlets 156, the airflow can flow out of the first air outlets 154 and the second air outlets 156 towards other electronic elements (not drawn) on the motherboard 110, such as a power module, a hard disk or an expansion card, so as to provide the electronic device 100 with good heat dissipation efficiency. In addition, these electronic elements may be provided with additional corresponding wind scoopers, so as to help the airflow flows to these electronic devices and thus improve the heat dissipation efficiency.

When the wind scooper 150 is fixed on the heat dissipation modules 120 through the cooperation between the first positioning component 120a and the second positioning component 150a, and further fixed on the fan module 130 through the cooperation between the third positioning component 130a and the fourth positioning component 150b, the third positioning component 130a and the fourth positioning component 150b are located at the air inlet 152. Meanwhile, the first positioning component 120a and the second positioning component 150a are respectively located at the first air outlets 154. In this way, the wind scooper 150 can be fixed on the heat dissipation modules 120 and the fan module 130 stably.

Referring to FIG. 2, in this embodiment, the fourth positioning component 150b located at the air inlet 152 of the wind scooper 150 is a positioning column 152a arranged at the air inlet 152 of the wind scooper 150. The second positioning component 150a located at the first air outlets 154 of the wind scooper 150 is a fastener 154a arranged at the first air outlets 154. The wind scooper 150 can be fixed on the fan module 130 and the heat dissipation modules 120 through the positioning column 152a and the fastener 154a. Therefore, for the electronic device, the wind scooper 150 and other parts of the electronic device 100 are stably combined without additional fixing elements. More detailed description will be given hereafter.

Figure 3:
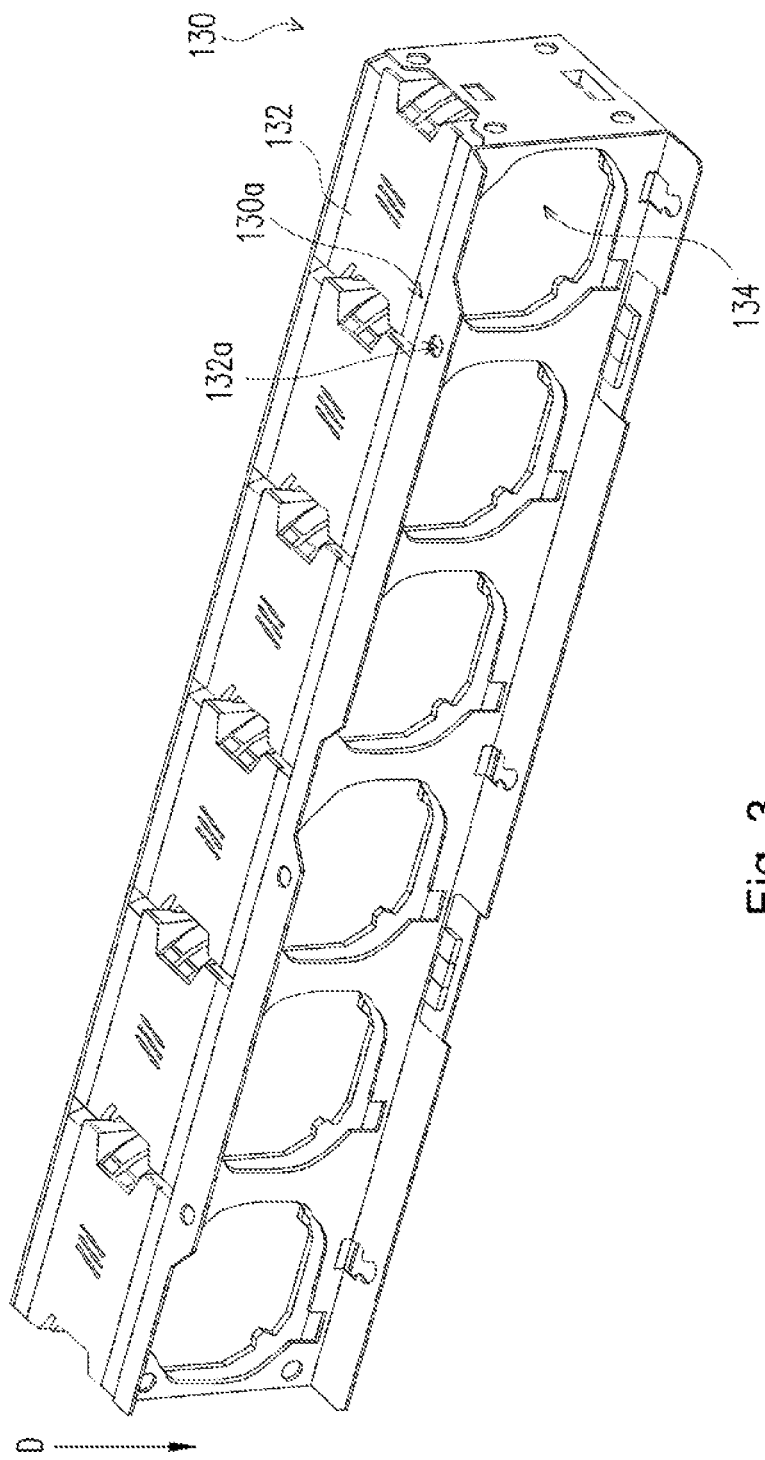
FIG. 3 is a schematic diagram of a fan module shown in FIG. 1.

FIG. 3 is a schematic diagram of a fan module shown in FIG. 1. Referring both to FIGS. 1 and 3, in the embodiment, the fan module 130 includes a fan bracket 132 and a plurality of fans 134. The fan bracket 132 is arranged on one side of the motherboard 110. The fans 134 are arranged in the fan bracket 132. In this embodiment, the fan module 130 is described as having six fans. However, the number of the fans of the fan module can be adjusted in the electronic device according to the demands, but the present disclosure is not limited to that.

The fans 134 are arranged in one row in the fan bracket 132, and face the heat dissipation modules 120 and the memory modules 140 arranged on the motherboard 110, so that the airflow provided by the fan module 130 can be blown to the heat dissipation modules 120 and the memory modules 140 to dissipate heat. The third positioning component 130a is the positioning hole 132a arranged on fan bracket 132. The positioning hole 132a is located on the upper edge of the fan bracket 132, and the upper edge of the fan bracket 132 correspond to that of the air inlet 152 of the wind scooper 150. The wind scooper 150 is assembled to the fan module 130 through the cooperation between the third positioning component 130a and the fourth positioning component 150b, so that the air inlet 152 corresponds to the fan module 130. Therefore, the airflow is blown to the heat dissipation modules 120 and the memory modules 140 more intensively, so that the heat dissipation efficiency is improved.

Figure 4:
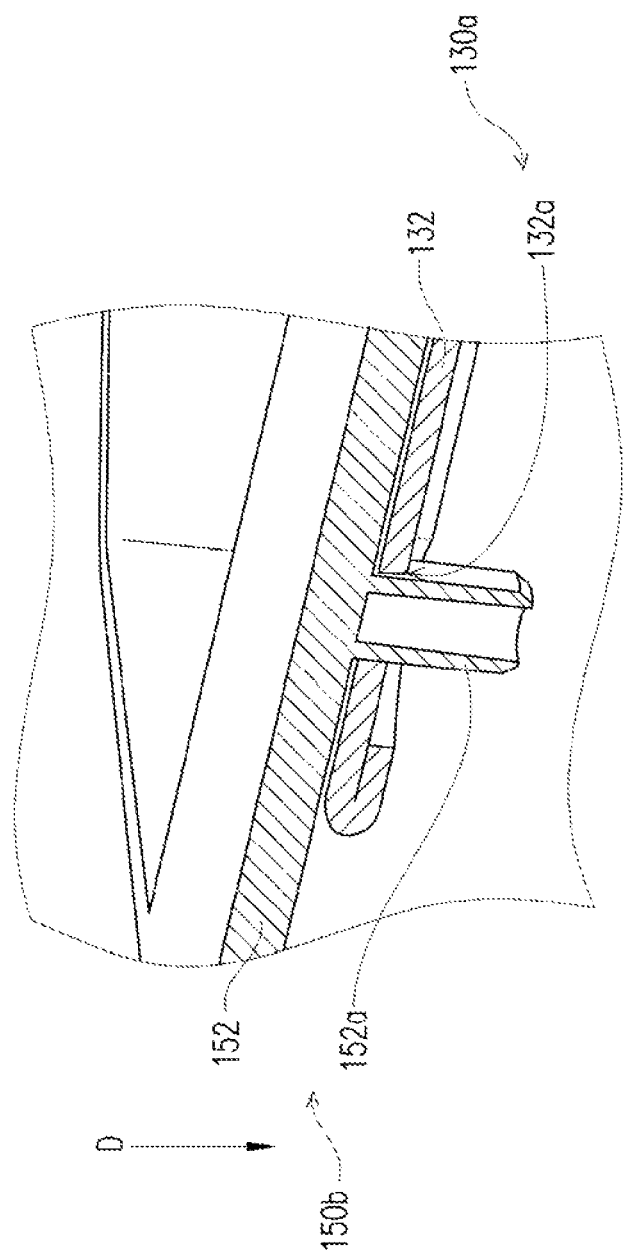
FIG. 4 is a partially-enlarged cross-sectional view of the electronic device shown in FIG. 1.

FIG. 4 is a partially-enlarged cross-sectional view of the electronic device shown in FIG. 1. Referring to FIGS. 2 to 4, in this embodiment, the air inlet 152 of the wind scooper 150 has three positioning columns 152a, and the fan bracket 132 has three positioning holes 132a. The positioning columns 152a extend from the upper edge of the air inlet 152 along an assembly direction D, so that the wind scooper 150 can be assembled to the fan module 130 by enabling the positioning columns 152a to correspondingly penetrate into the positioning holes 132a along the assembly direction D. Therefore, the air inlet 152 of the wind scooper 150 precisely corresponds to the fans 134 of the fan module 130, so that the airflow intensiveness is improved and the wind scooper 150 is prevented from being displaced.

Additionally, in this embodiment, the wind scooper 150 is described as having three positioning columns 152a, and the fan bracket 132 has three positioning holes 132a corresponding to the wind scooper 150. However, in other embodiments, the number of the positioning columns of the wind scooper can be adjusted in the electronic device, and meanwhile, the number of the positioning holes is adjusted according to that of the positioning columns, but the present disclosure is not limited to that. In addition, in other embodiments, the third positioning component and the fourth positioning component also may be combined in other forms. The combination of the third positioning component and the fourth positioning component is not limited to the combination of the positioning columns and the positioning holes in the present disclosure.

Figure 5:
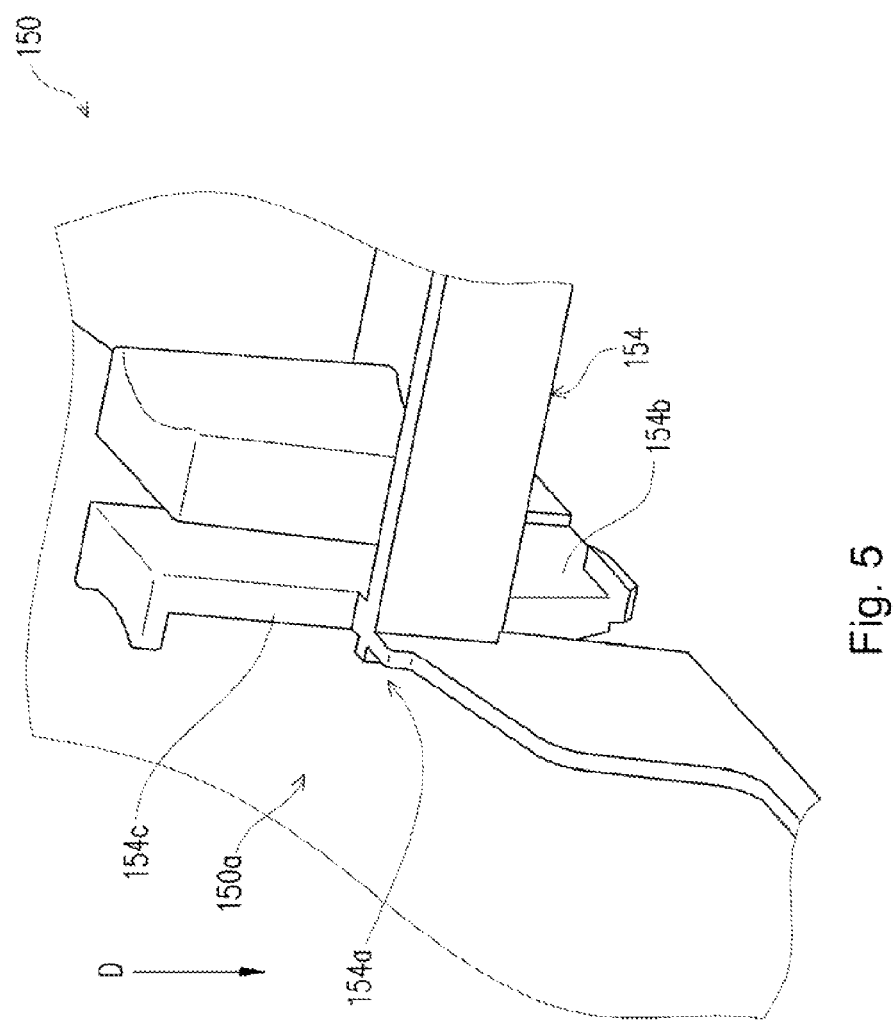
FIG. 5 is a partially-enlarged schematic view of a first air outlet shown in FIG. 2.

FIG. 5 is a partially-enlarged schematic diagram of a first air outlet shown in FIG. 2. Referring to FIGS. 2 to 5, in this embodiment, the second positioning component 150a located at the first air outlets 154 of the wind scooper 150 is a fastener 154a arranged at the first air outlets 154. Particularly, the fastener 154a has a fastening hook component 154b and a pressing component 154c. The fastening hook component 154b is located in the first air outlets 154, and the pressing component 154c protrudes beyond the wind scooper 150 and is located on the outer side of the first air outlets 154.

Particularly, the fastening hook component 154b extends from the upper edge of the first air outlet 154 into the first air outlet 154 along the assembly direction D, and the pressing component 154c protrudes beyond the first air outlet 154 along the reverse direction of the assembly direction D. Therefore, the wind scooper 150 can be fixed on the heat dissipation modules 120 by assembling the fasteners 154a onto the heat dissipation modules 120 along the assembly direction D.

Figure 6:
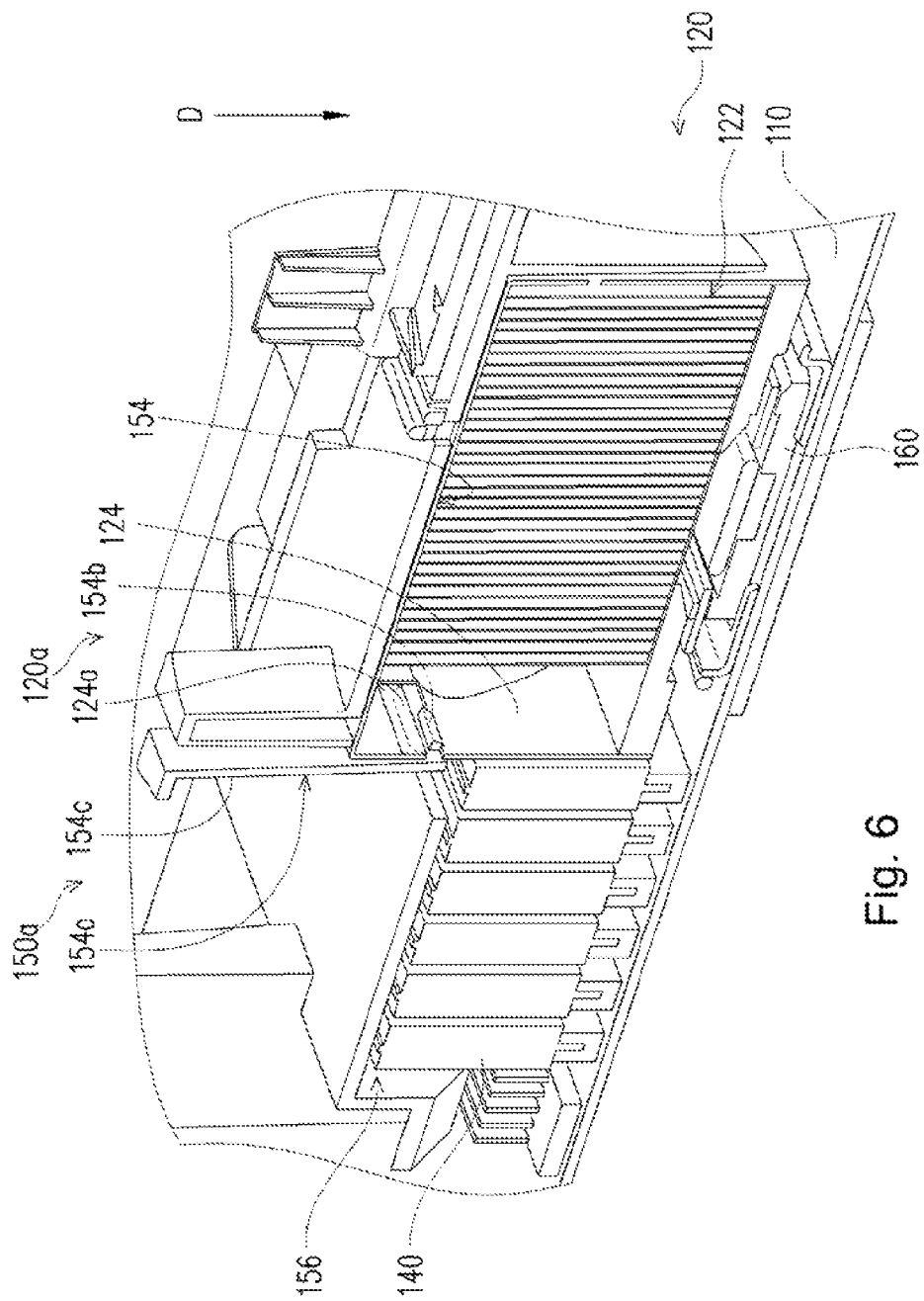
FIG. 6 is a partially-enlarged cross-sectional view of the electronic device shown in FIG. 1.

FIG. 6 is a partially-enlarged cross-sectional view of the electronic device shown in FIG. 1. Referring to FIG. 6, in this embodiment, the heat dissipation module 120 includes a heat dissipation element 122 and a heat dissipation enclosure 124. The heat dissipation element 122 is arranged in the heat dissipation enclosure 124. The heat dissipation element 122, for example, is a heat dissipation fin group. The heat dissipation enclosure 124, for example, is a sheet metal enclosure. However, the types and the materials of the heat dissipation element and the heat dissipation enclosure are not limited in the present disclosure. In addition, the memory module 140, for example, is a memory card group, but the type of the memory module is not limited in the present disclosure.

Referring to FIG. 6, the first positioning component 120a is the fastening convex component 124 arranged on and protruding beyond the heat dissipation enclosure 124. The wind scooper 150 is fixed onto the heat dissipation modules 120 by fastening the fastening hook component 154b correspondingly onto the fastening convex component 124a along the assembly direction D. Particularly, when the wind scooper 150 is assembled to the heat dissipation module 120 along the assembly direction D, the fastening hook component 154b of the wind scooper 150 firstly moves favorably along the assembly direction D as being squeezed by the fastening convex parts 124a. Moreover, after the fastening hook component 154b crosses over the fastening convex component 124a, the wind scooper 150 is fastened to the lower edge of the fastening convex component 124a through the recovery force of materials. Therefore, the wind scooper 150 is fixed on the heat dissipation module 120 and thus is prevented from being displaced.

The combination of the positioning column 152a and the positioning hole 132a is compared with that of the fastening hook component 154b and the fastening convex component 124a. The positioning columns 152a and the positioning holes 132a have the function of positioning, but the positioning columns 152a still can move out of the positioning holes 132a along the direction reverse to the assembly direction D. In other words, the combination of the positioning columns 152a and the positioning holes 132a only can enable that the wind scooper 150 is not displaced in the directions except the assembly direction D and the reverse direction thereof.

On the contrary, after the fastening hook component 154b is fastened onto the fastening convex component 124a, the shapes of the fastening hook component 154b and the fastening convex component 124a interfere with each other, so that the wind scooper 150 is completely fixed on the heat dissipation module 120. That is, the wind scooper 150 is not displaced in the assembly direction D and the reverse direction thereof. As such, the wind scooper 150 can be fixed on the heat dissipation module 120 stably.

However, it is not impossible to disassemble the wind scooper 150. When it needs to disassemble/assemble or repair the fan module 130, the heat dissipation modules 120 or the memory modules 140, the fastening relation between the fastening hook parts 154b and the fastening convex parts 124a can be released in the wind scooper 150 by pressing the pressing parts 154c of the fasteners 154a. Therefore, the fixing relation between the wind scooper 150 and the fan module 130 and between the wind scooper 150 and the heat dissipation modules 120 are further released. Therefore, the wind scooper 150 is removed to expose the fan module 130, the heat dissipation modules 120 and the memory modules 140.

Particularly, the fasteners 154 drawn in FIG. 6 are taken as examples. When the wind scooper 150 is assembled to the heat dissipation modules 120, the fastening hook parts 154b of the wind scooper 150 are pushed by the fastening convex parts 124a towards the left direction of FIG. 6, so that the fastening hook parts 154b cross over the fastening convex parts 124a. After crossing over the fastening convex parts 124a, the fastening hook parts 154b are fastened to the lower edges of the fastening convex parts 124a towards the right direction of FIG. 6.

When it is wanted to disassemble the wind scooper 150 from the heat dissipation modules 120, the pressing parts 154c are pressed towards the right direction of FIG. 6. Therefore, the fastening hook parts 154b are moved out of the fastening convex parts 124a towards the left direction of FIG. 6 corresponding to the pressing parts 154c, and thus the fastening relation between the fastening hook parts 154b and the fastening convex parts 124a are further released, resulting in that the wind scooper 150 can be removed along the direction reverse to the assembly direction D.

Similarly, when it is wanted to reassemble the wind scooper 150 onto the heat dissipation modules 120 and the fan modules 130, it only needs to enable the positioning columns 152a of the wind scooper 150 to correspondingly penetrate into the positioning holes 132a and fasten the fastening convex parts 124a onto the fastening convex parts 124a. Therefore, the wind scooper 150 can be re-fixed on the heat dissipation modules 120 and the fan modules 130. However, in other embodiments, the first positioning component and the second positioning component may be combined in other forms. In the present disclosure, the combination of the first positioning component and the second positioning component is not limited to the combination of the fastening hook parts and the fastening convex parts. As such, the wind scooper 150 is stably combined with other parts of the electronic device 100, which is beneficial for the disassembling/assembling and repairing of other parts of the electronic device 100.

As described above, the heat dissipation modules of the electronic device of the present disclosure has the first positioning component, and the wind scooper has the second positioning component. In this way, the wind scooper is fixed on the heat dissipation modules through the cooperation between the first positioning component and the second positioning component. In addition, the fan module has the third positioning component, and the wind scooper has the fourth positioning component. In this way, the wind scooper is fixed on the fan module through the cooperation between the third positioning component and the fourth positioning component. Therefore, for the electronic device, the wind scooper is stably combined with other parts of the electronic device without the additional fixing elements. Therefore, the wind scooper is further prevented from being displaced to strike and damage the other parts of the electronic device during the transportation process. As such, the electronic device can improve the stability of the wind scooper which is capable of being assembled/disassembled by the tool.

Although the present disclosure has been disclosed with reference to the above embodiments, these embodiments are not intended to limit the present disclosure. It will be apparent to those skilled in the art that various modifications and variations can be made without departing from the scope or spirit of the present disclosure. Therefore, the scope of the present disclosure shall be defined by the appended claims.

What is claimed is:

1. An electronic device, comprising:
a motherboard;
at least one heat dissipation module, arranged on the motherboard and provided with a first positioning component, the first positioning component being a fastening convex component;
a fan module arranged on one side of the motherboard and facing the heat dissipation module; and
a wind, scooper, provided with a second positioning component corresponding to the first positioning component, wherein the second positioning component is a fastener arranged on the wind scooper, the fastener has a fastening hook component; the wind scooper is fixed on the heat dissipation module through the fastening hook component being fastened to a lower edge of the fastening convex component in an assembly direction, and the fastening hook component is unfastened from the fastening convex component when the fastening hook component is squeezed by the fastening convex component along a direction substantially perpendicular to the assembly direction; and the wind scooper is connected between the fan module and the heat dissipation module, so that the airflow provided by the fan module flows through the heat dissipation module.

2. The electronic device of claim 1, Wherein the heat dissipation module comprises a heat dissipation element and a heat dissipation enclosure; the heat dissipation element is placed in the heat dissipation enclosure; the fastening convex component protrudes beyond the heat dissipation enclosure; and the wind scooper is fixed onto the heat dissipation modules by fixing the fastening hook component to the fastening convex component.

3. The electronic device of claim 2, wherein the fastener has a pressing component; the pressing component protrudes beyond the wind scooper; and the fastening relation between the fastening hook component and the fastening convex component is released by pressing the pressing component.

4. The electronic, device of claim 1, wherein the fan module further has a third positioning component; the wind scooper further has a fourth positioning component corresponding to the third positioning component; and the wind scooper is fixed on the fan module through the cooperation between the third positioning component and the fourth positioning component.

5. The electronic device of claim 4, wherein the fan module comprises a fan bracket and a plurality of fans; the fan bracket is arranged on one side of the motherboard; and the fans are arranged in the fan bracket.

6. The electronic device of claim 5, wherein the fourth positioning component is at least one positioning column arranged on the wind scooper; the third positioning component is at least one positioning hole arranged on the fan bracket; and the wind scooper is assembled onto the fan module by enabling the positioning column to correspondingly penetrate into the positioning hole.

7. The electronic device of claim 4, wherein the wind scooper comprises an air inlet and at least one first air outlet; the air inlet is located on a first side of the wind scooper corresponding to the fan module; the first air outlets are located on a second side of the wind scooper corresponding to the heat dissipation modules; so that the airflow provided by the fan module flows through the heat dissipation module via the first air outlet from the wind inlet, wherein the second side is opposite to the first side; the third positioning component and the fourth positioning component are located at the air inlet; and the first positioning component and the second positioning component are located at the first air outlet.

8. The electronic device of claim 7, wherein the electronic device further comprises at least one memory module arranged on the motherboard and located on one side of the heat dissipation module; the wind scooper further includes at least one second air outlet; and the second air outlet is located on the second side of the wind scooper corresponding to the memory module and is adjacent to the first air outlet, so that the airflow provided by the fan module flows through the memory module via the second air outlet from the wind inlet.

9. The electronic device of claim 8, wherein the number of the at least one dissipation module and the number of the at least one memory module are both two, and the two heat dissipation modules and the two memory modules are arranged on the motherboard as being staggered; and the number of the at least one first air outlet and the number of the at least one second air outlet are both two, and the two first air outlets and the two second air outlets are arranged on the second side as being staggered, so that the first air outlets and the second air outlets respectively correspond to the heat dissipation modules and the memory modules.

10. The electronic device of claim 2, wherein the electronic device further comprises at least one heating element, which is arranged on the motherboard; the heat dissipation module thermally contacts the heating element, and the airflow provided by the fan module flows from the wind inlet to the heating element via the first air outlet.

* * * * *